(12) United States Patent
Cok

(10) Patent No.: US 8,619,008 B2
(45) Date of Patent: Dec. 31, 2013

(54) DIVIDING PIXELS BETWEEN CHIPLETS IN DISPLAY DEVICE

(75) Inventor: Ronald S. Cok, Rochester, NY (US)

(73) Assignee: Global OLED Technology LLC, Herndon, VA (US)

( * ) Notice: Subject to any disclaimer, the term of this patent is extended or adjusted under 35 U.S.C. 154(b) by 606 days.

(21) Appl. No.: 12/370,646

(22) Filed: Feb. 13, 2009

(65) Prior Publication Data
US 2010/0207852 A1 Aug. 19, 2010

(51) Int. Cl.
*G09G 3/32* (2006.01)

(52) U.S. Cl.
USPC .......................................................... 345/83

(58) Field of Classification Search
USPC ................................... 345/83, 205
See application file for complete search history.

(56) References Cited

U.S. PATENT DOCUMENTS

| 4,661,809 | A | * | 4/1987 | Anderson et al. | ............... 345/86 |
| 4,775,861 | A | * | 10/1988 | Saito | .............................. 345/93 |
| 6,384,529 | B2 | | 5/2002 | Tang | |
| 6,919,681 | B2 | | 7/2005 | Cok et al. | |
| 6,987,355 | B2 | | 1/2006 | Cok | |
| 7,230,594 | B2 | | 6/2007 | Miller et al. | |
| 2006/0055864 | A1 | | 3/2006 | Matsumura et al. | |
| 2007/0139437 | A1 | | 6/2007 | Boroson et al. | ............... 345/590 |

FOREIGN PATENT DOCUMENTS

| JP | 2002244576 A | * | 8/2002 |
| WO | WO 2010/008441 A1 | | 1/2010 |
| WO | WO 2010/019185 A1 | | 2/2010 |

OTHER PUBLICATIONS

English translation of Japanese Patent Publication of JP2002-244576A.*

* cited by examiner

*Primary Examiner* — Nicholas Lee
(74) *Attorney, Agent, or Firm* — Global OLED Technology LLC

(57) ABSTRACT

A display device includes a substrate, a plurality of pixels formed over the substrate, each pixel including two or more sub-pixels, the plurality of pixels defining a display area, and a plurality of chiplets located over the substrate in the display area, each chiplet controlling sub-pixels of at least two adjacent pixels.

13 Claims, 14 Drawing Sheets

DIVIDING PIXELS BETWEEN CHIPLETS IN DISPLAY DEVICE

FIELD OF THE INVENTION

The present invention relates to display devices having a substrate with distributed, independent chiplets for controlling a pixel array and, more particularly, to the control of sub-pixels in for each pixel in the array.

BACKGROUND OF THE INVENTION

Flat-panel display devices are widely used in conjunction with computing devices, in portable devices, and for entertainment devices such as televisions. Such displays typically employ a plurality of pixels distributed over a substrate to display images. Each pixel incorporates several, differently colored light-emitting elements commonly referred to as sub-pixels, typically emitting red, green, and blue light, to represent each image element or pixel. A variety of flat-panel display technologies are known, for example plasma displays, liquid crystal displays, and light-emitting diode (LED) displays.

Light emitting diodes (LEDs) incorporating thin films of light-emitting materials forming light-emitting elements have many advantages in a flat-panel display device and are useful in optical systems. U.S. Pat. No. 6,384,529 issued May 7, 2002 to Tang et al. shows an organic LED (OLED) color display that includes an array of organic LED light-emitting elements. Alternatively, inorganic materials can be employed and can include phosphorescent crystals or quantum dots in a polycrystalline semiconductor matrix. Other thin films of organic or inorganic materials can also be employed to control charge injection, transport, or blocking to the light-emitting-thin-film materials, and are known in the art. The materials are placed upon a substrate between electrodes, with an encapsulating cover layer or plate. Light is emitted from a pixel when current passes through the light-emitting material. The frequency of the emitted light is dependent on the nature of the material used. In such a display, light can be emitted through the substrate (a bottom emitter) or through the encapsulating cover (a top emitter), or both.

LED devices can include a patterned light-emissive layer wherein different materials are employed in the pattern to emit different colors of light when current passes through the materials. Alternatively, one can employ a single emissive layer, for example, a white-light emitter, together with color filters for forming a full-color display, as is taught in U.S. Pat. No. 6,987,355 entitled, "Stacked OLED Display having Improved Efficiency" by Cok. It is also known to employ a white sub-pixel that does not include a color filter, for example, as taught in U.S. Pat. No. 6,919,681 entitled, "Color OLED Display with Improved Power Efficiency" by Cok et al. A design has been taught employing an unpatterned white emitter together with a four-color pixel comprising red, green, and blue color filters and sub-pixels and an unfiltered white sub-pixel to improve the efficiency of the device (see, e.g. U.S. Pat. No. 7,230,594 issued Jun. 12, 2007 to Miller, et al).

Pixels can employ different arrangements of sub-pixels. For example, one arrangement locates the sub-pixels of a pixel in a row, forming colored stripes in the column direction. In some designs, neighboring rows are offset forming a delta pattern. In designs employing four sub-pixels in a pixel, the four sub-pixels can be arranged in a two-by-two array, also known as a quad pattern. Typically, the sub-pixels are equally spaced and are uniformly distributed over the substrate to form a regular array of equally spaced pixels.

Two different methods for controlling the pixels in a flat-panel display device are generally known: active-matrix control and passive-matrix control. In a passive-matrix device, the substrate does not include any active electronic elements (e.g. transistors). An array of row electrodes and an orthogonal array of column electrodes in a separate layer are formed over the substrate; the overlapping intersections between the row and column electrodes form the electrodes of a light-emitting diode. External driver chips then sequentially supply current to each row (or column) while the orthogonal column (or row) is supplied a suitable voltage to drive current through each light-emitting diode in the row (or column). Each sub-pixel is treated as a separately controlled element.

In an active-matrix device, active control elements are formed of thin films of semiconductor material, for example amorphous or poly-crystalline silicon, coated over the flat-panel substrate. The semiconductor materials are formed into thin-film transistors and capacitors through photolithographic processes. Thin-film transistors (TFTs) made from amorphous or polycrystalline silicon are relatively large and have lower performance compared to conventional transistors made in crystalline silicon wafers. Moreover, such thin-film devices typically exhibit local or large-area non-uniformity across the glass substrate that results in non-uniformity in the electrical performance and visual appearance of displays employing such materials.

Typically, each sub-pixel is controlled by one control element and each control element includes at least one transistor. For example, in a simple active-matrix organic light-emitting (OLED) display, each control element includes two transistors (a select transistor and a power transistor) and one capacitor for storing a charge specifying the luminance of the sub-pixel. Each light-emitting element typically employs an independent control electrode and an electrode electrically connected in common. Control of the light-emitting elements is typically provided through a data signal line, a select signal line, a power connection and a ground connection. Designers typically ensure that the active-matrix circuits and sub-pixel elements are uniformly distributed over the substrate. Each sub-pixel is treated as a separately controlled element.

Employing an alternative control technique, Matsumura et al., in U.S. Patent Application 2006/0055864, describe crystalline silicon substrates separate from a display substrate used for driving LCD displays. The application describes a method for selectively transferring and affixing pixel-control devices made from first semiconductor substrates onto a second planar display substrate. Wiring interconnections within the pixel-control device and connections from busses and control electrodes to the pixel-control device are shown. Compared to active-matrix circuits, chiplets are relatively large, although there can be relatively fewer of the chiplets than of the alternative thin-film active-matrix circuits. The larger chiplets can detrimentally affect the image quality of the display. Optimized arrangements of sub-pixels and pixels are not disclosed.

There is a need for an improved sub-pixel arrangement in displays employing driving circuits having silicon substrates separate from the display substrate.

SUMMARY OF THE INVENTION

In accordance with the present invention, there is provided a display device comprising:

a) a substrate;

b) a plurality of pixels formed over the substrate, each pixel including two or more sub-pixels, the plurality of pixels defining a display area; and c) a plurality of chiplets located over the substrate in the display area, each chiplet controlling sub-pixels of at least two adjacent pixels.

ADVANTAGES

The present invention has the advantage that, by providing pixels having sub-pixels controlled by more than one chiplet, improved color mixing and pixel uniformity is achieved.

Figure 1:
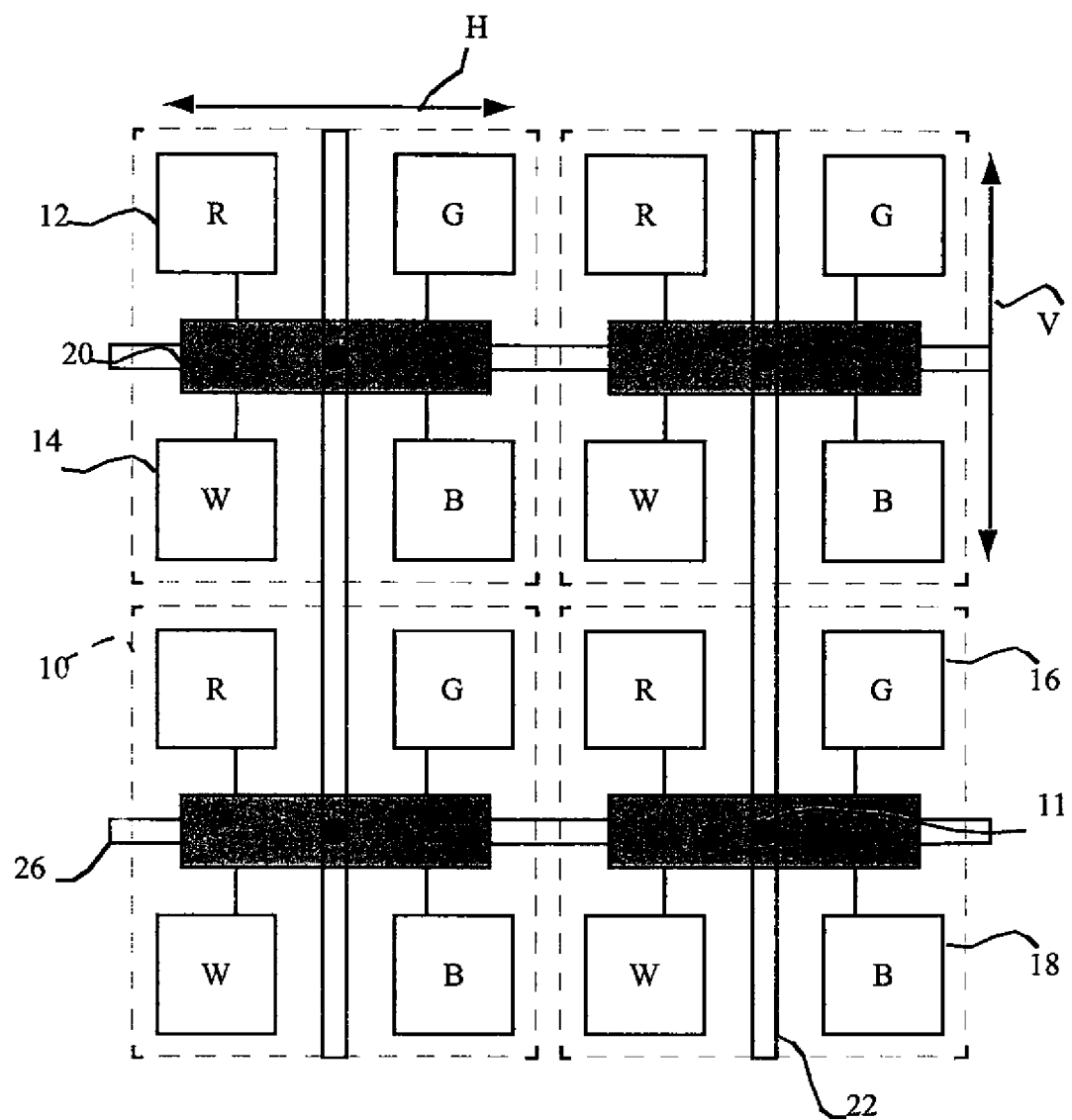
FIG. 1 is a schematic illustrating a display portion having a quad pixel controlled by individual chiplets useful in understanding the present invention.

Because the various layers and elements in the drawings have greatly different sizes, the drawings are not to scale.

DETAILED DESCRIPTION OF THE INVENTION

Conventional active-matrix displays employ thin-film transistor circuits comprising amorphous or polysilicon films deposited on a substrate to control the display elements. These thin-film transistors, however, have much lower performance than the crystalline silicon devices typically used in integrated circuits. An alternative control method for active-matrix devices employs a plurality of chiplets located over a substrate in the light-emitting area of a display. Each chiplet is formed on a substrate independent of the display substrate and includes circuitry and connection pads for driving the electrodes of the light-emitting or light-controlling elements in the display and for responding to signals from a controller external to the display.

Referring to FIG. 1, a partial schematic of a display device illustrates a plurality of pixels 10 including four sub-pixels defining a light-emitting display area. The display device further includes a plurality of chiplets 20 located over the display area on a display substrate for controlling sub-pixels (e.g. red sub-pixels 12, green sub-pixels 16, blue sub-pixels 18, and white sub-pixels 14). In this figure, each four-element pixel 10 includes four sub-pixels emitting light of four different colors. The sub-pixels are arranged in a two-by-two, or quad, configuration. Each chiplet 20 controls four sub-pixels making up one pixel 10 and has a horizontal size H, a vertical size V, and a pixel area that is the product of H and V. Note that the pixel area includes non-emitting space between light-emitting sub-pixels so that the emissive area is less than the pixel area. As used herein, pixel area refers to the total area over a substrate that a pixel occupies, including non-light-emitting spaces between the sub-pixels in the pixel, and defines the size of the pixel. The center 11 of each pixel 10 can be the point that is equidistant from each sub-pixel in a pixel, depending on the arrangement of the sub-pixels in the pixel. Alternatively, the center 11 can be considered the middle of each pixel 10, or the centroid of the pixel, including all of the light-emitting area of the sub-pixels. In this example, each chiplet controls all of the sub-pixels in a pixel. This arrangement is taught in co-pending, commonly-assigned U.S. patent application Ser. No. 12/191,478, filed Aug. 14, 2008.

Figure 14:
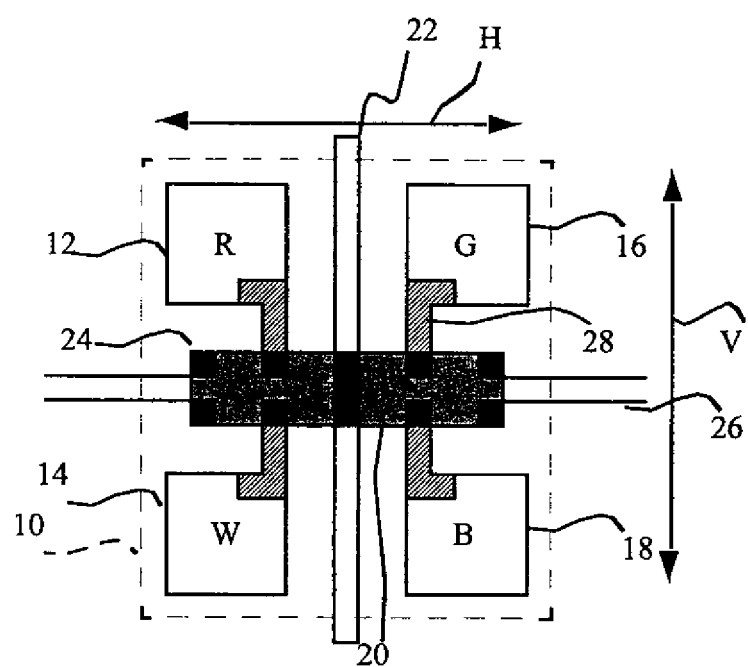
FIG. 14 is a schematic illustrating a chiplet controlling a pixel having four sub-pixels useful in understanding the present invention.

Referring to FIG. 14, a chiplet 20 and the sub-pixels 12, 14, 16, 18 controlled by the chiplet 20 are illustrated in more detail. Each chiplet 20 includes connection pads 24 for controlling sub-pixels or for receiving signals on bus lines 22, 26 from an external controller. As shown, to increase the light-emitting area, the busses 22, 26 are grouped together and connected to the ends of the chiplets 20 in a long chiplet direction (26) or are connected to the center of the chiplet (22). Conductors 28 (e.g. metal wires) electrically connect the chiplet connection pads to the sub-pixels, for example to the electrodes of a light-emitting diode, such as an organic light-emitting diode (OLED). Busses 22 can include conductors, e.g. metal wires. A plurality of such electrically conducting wires can be included in each buss.

The design of FIG. 1 is a simple arrangement. However, in flat-panes displays, it is important that each pixel be small enough that a viewer cannot resolve the individual sub-pixels within the pixel at an appropriate viewing distance, thereby providing an apparently full-color single light-emitter with the colors in the pixel completely mixed. If the spacing of the pixel is too large, a viewer can distinguish the sub-pixels, thereby decreasing the image quality. With very large pixel spacings, the image can be unrecognizable to the viewer.

Furthermore, the chiplets 20 and supporting busses 22, 26 can occupy a relatively large area compared to, for example, individual thin-film circuits in a conventional active-matrix display. These large areas are not necessarily uniformly distributed among the light-emitting sub-pixels, thereby causing image artifacts in the display. Moreover, the centers of the pixel might not be uniformly distributed in the display. These deficiencies in chiplet-based displays are overcome with the present invention.

Figure 2:
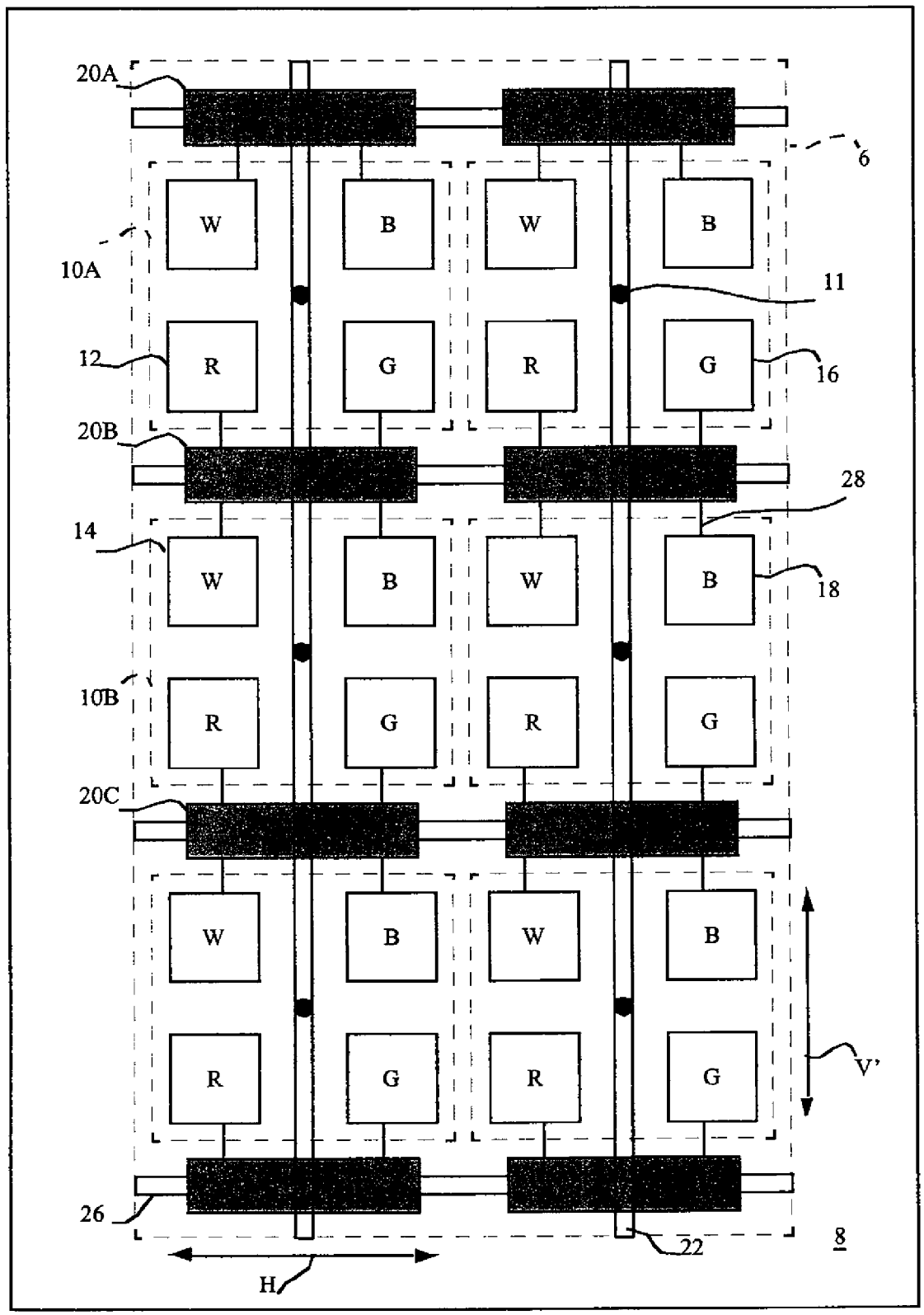
FIG. 2 is a schematic illustrating quad pixels having sub-pixels controlled by two different chiplets in two different rows according to an embodiment of the present invention.

Referring to FIG. 2, in one embodiment of the present invention, a display device includes a substrate 8, a plurality of pixels formed over the substrate 8, each pixel including two or more sub-pixels 12, 14, 16, 18, the plurality of pixels defining a display area 6. A plurality of chiplets are located over the substrate 8 in the display area 6, each chiplet controlling sub-pixels in at least two adjacent pixels. Adjacent pixels on a substrate are immediately neighboring pixels. In some embodiments of the present invention, the chiplets can be disposed between the pixels. At least one sub-pixel of a pixel is controlled by a first chiplet and at least one other sub-pixel of the same pixel is controlled by a second chiplet. Conductors 28 connect sub-pixels to a chiplet and indicate the sub-pixels controlled by the chiplet. For example, chiplet 20B controls the white (W), blue (B), red (R), and green (G) sub-pixels to which it is connected and chiplet 20C controls the white (W), blue (B), red (R), and green (G) sub-pixels to which it is connected. Each pixel 10 includes four sub-pixels. In this example, pixel 10A includes the W and B sub-pixels controlled by chiplet 20A and the R and G sub-pixels controlled by chiplet 20B. Pixel 10B includes the W and B sub-pixels controlled by chiplet 20B and the R and G sub-pixels controlled by chiplet 20C. Hence, the sub-pixels W and B of one pixel are controlled by one chiplet and the sub-pixels R and G of the same pixel are controlled by a second, different chiplet. This arrangement has the advantage of reducing the vertical spacing V' of the pixels; as indicated V' (FIG. 2) is less than V (FIG. 1). Hence, the sub-pixels 12, 14, 16, 18 within the pixels of FIG. 2 are not as readily resolved separately by a viewer, thereby providing better color mixing within the pixels 10.

Figure 3:
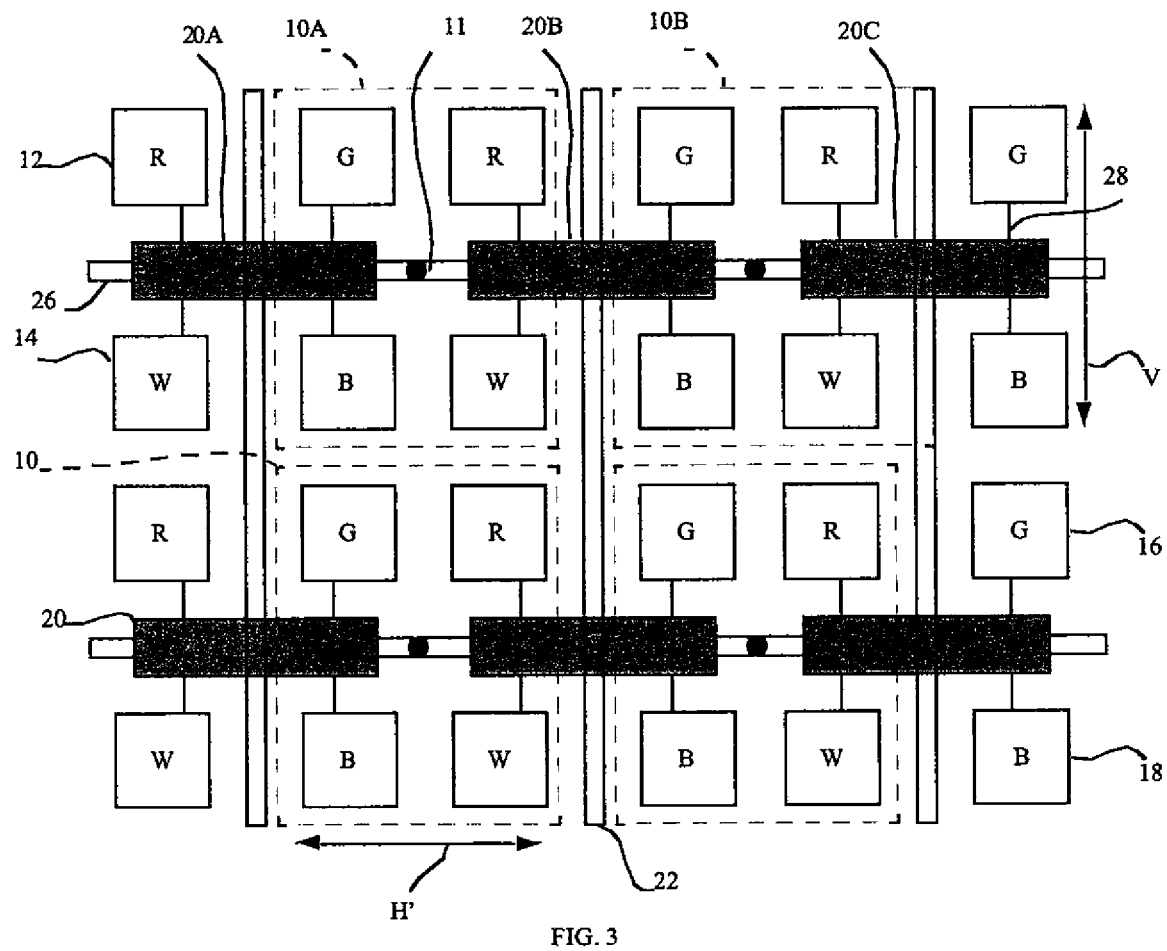
FIG. 3 is a schematic illustrating quad pixels having sub-pixels controlled by two different chiplets in two different columns according to an embodiment of the present invention.

The example of FIG. 2 illustrates improved pixel resolution in the vertical direction where sub-pixels are spaced apart by the chiplets. FIG. 3 illustrates a similar case in the horizontal direction. Referring to FIG. 3, busses 22 separate sub-pixels and (as indicated in FIG. 14) can be connected to the chiplets 20. Although the conductors of buss 22 (if there are more than one) can be distributed between each individual sub-pixel column, doing so can reduce the light-emitting area (aperture ratio) of the display since design rule tolerances of the manufacturing processes limit how closely the conductors or sub-pixels can be located. Furthermore, in chiplet designs busses can advantageously be connected to the center of the chiplets (as shown in FIG. 14). Although this connection method permits larger groups of conductors to be associated in non-light-emitting areas, it can space the sub-pixels of a pixel farther apart than is desired. Hence, according to an embodiment of the present invention, different sub-pixels of one pixel can be controlled by more than one chiplet. As shown in FIG. 3, chiplets 20A, 20B, and 20C control the R, G, B, and W sub-pixels to which they are connected with conductors 28. However, pixel 10A includes the G and B sub-pixels controlled by chiplet 20A and the R and W sub-pixels controlled by chiplet 20B. Similarly, pixel 10B includes the G and B sub-pixels controlled by chiplet 20B and the R and W sub-pixels controlled by chiplet 20C. The horizontal distance H' (FIG. 3) is less than the horizontal distance H (FIG. 1), thereby improving the color mixing of the pixels.

Figure 4:
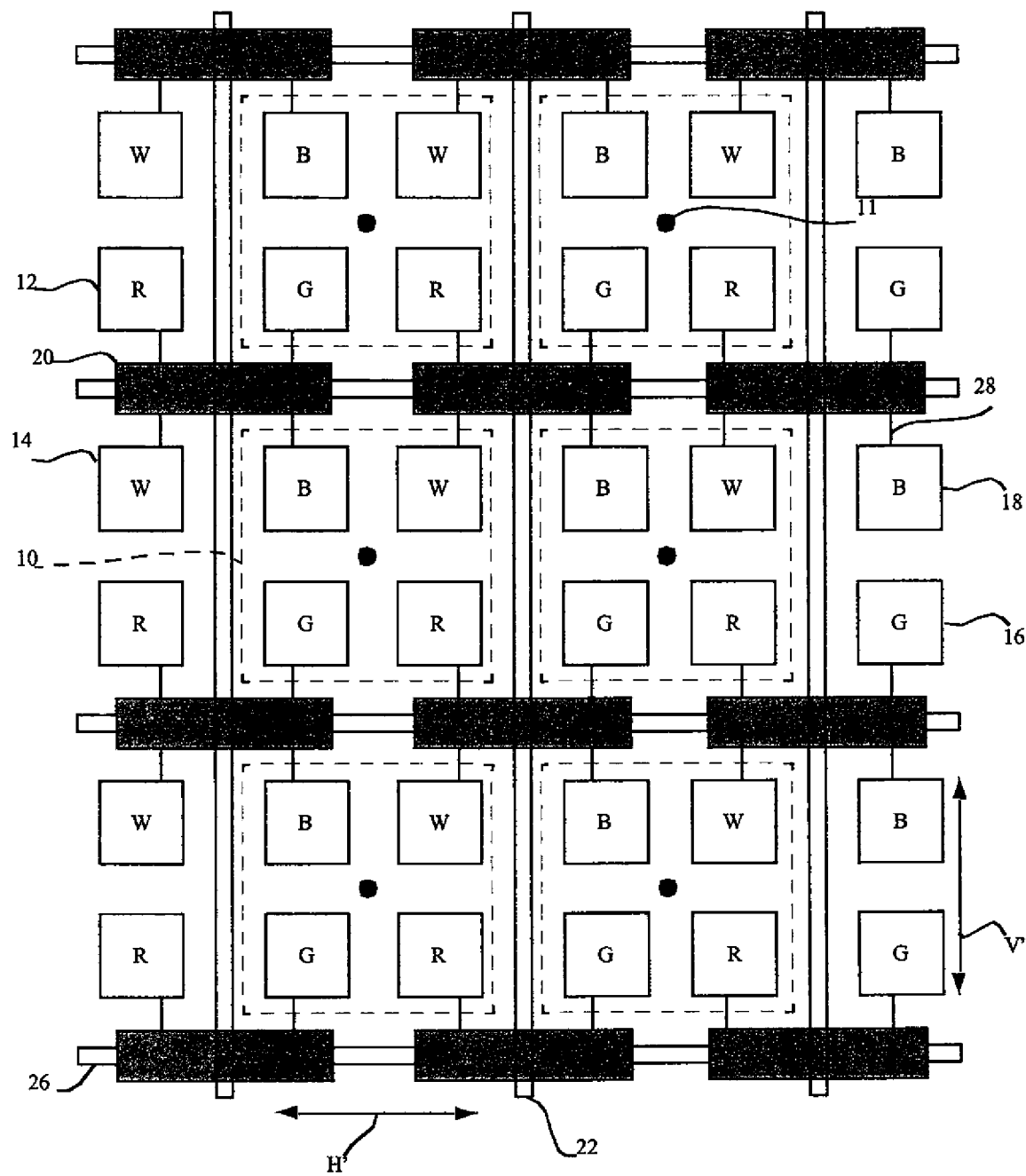
FIG. 4 is a schematic illustrating quad pixels having sub-pixels controlled by four different chiplets in two different rows and two different columns according to another embodiment of the present invention.

The present invention includes an embodiment that improves the sub-pixel color mixing in both horizontal and vertical directions. Referring to FIG. 4, each pixel is controlled by four chiplets so that there is no excessive spacing within the pixel due to the chiplets 20 or the busses 22 between the sub-pixels 12, 14, 16, 18 of each pixel 10. As shown in FIG. 4, a pixel 10 has a B sub-pixel controlled by a first chiplet, a W sub-pixel controlled by a second chiplet, a G sub-pixel controlled by a third chiplet, and an R sub-pixel controlled by a fourth chiplet. In this arrangement, the spacing H' is less than the spacing H of FIG. 1 and the spacing V' is less than the spacing V of FIG. 1, thereby improving the color mixing of the pixels. Hence, in the examples of FIGS. 2, 3, and 4, according to the present invention, the sub-pixels are formed in an array having rows or columns, the chiplets are located between spaced-apart sub-pixels in at least one, but not all, rows or columns, and the spacing between sub-pixels spaced apart by the chiplets is greater than the spacing between sub-pixels that are not spaced apart by the chiplets. Moreover, the sub-pixels are formed in an array having rows and columns, conductors are located between spaced-apart sub-pixels in at least one, but not all, rows or columns, and the spacing between sub-pixels spaced apart by the conductors is greater than the spacing between sub-pixels that are not spaced apart by the conductors. The conductors can form wires and include e.g. metal formed in one or more layers. By specifying the pixels as described, the color mixing of each pixel is improved.

Figure 5:
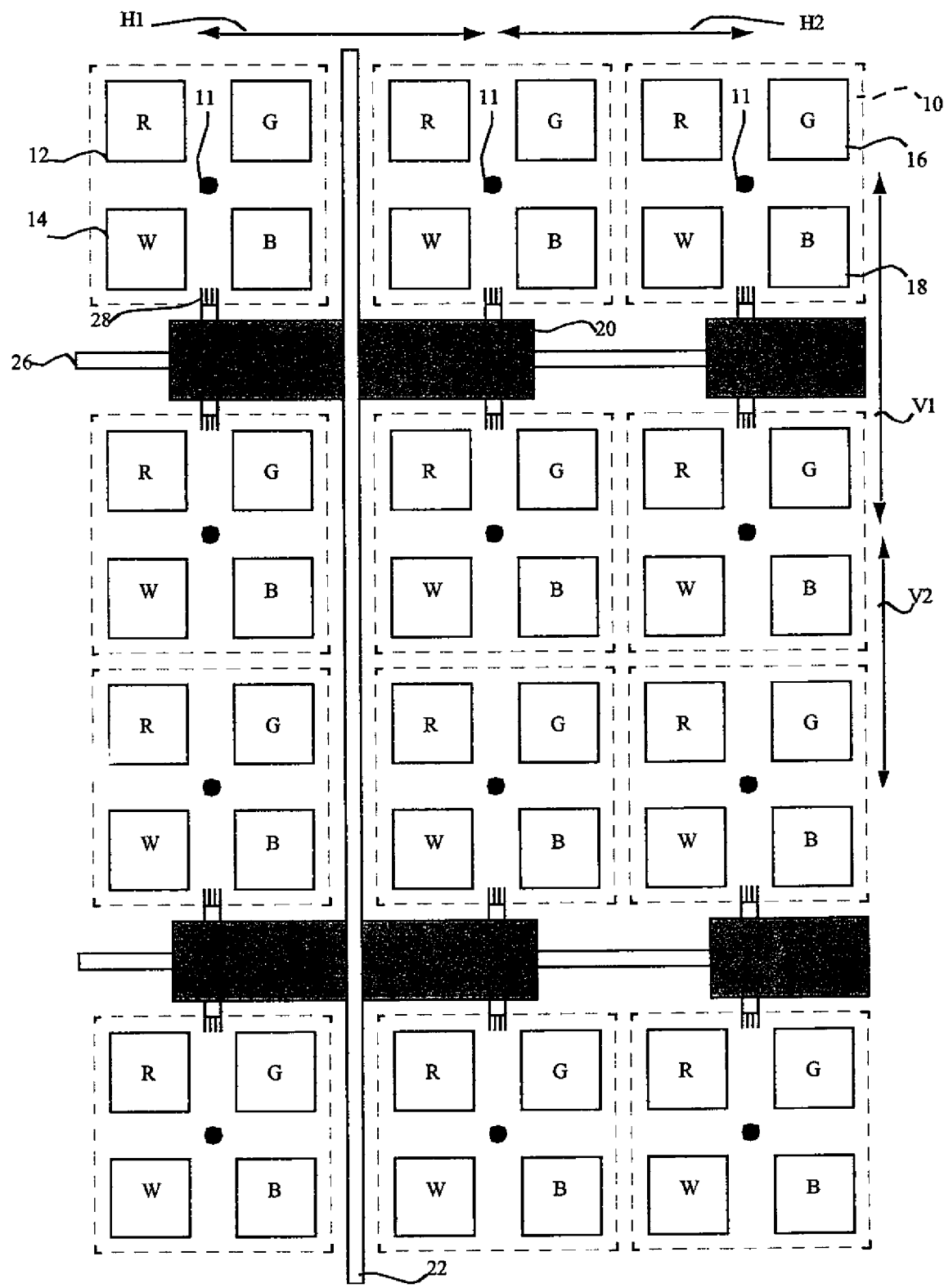
FIG. 5 is a schematic illustrating quad pixels controlled by individual chiplets useful in understanding the present invention.
Figure 15:
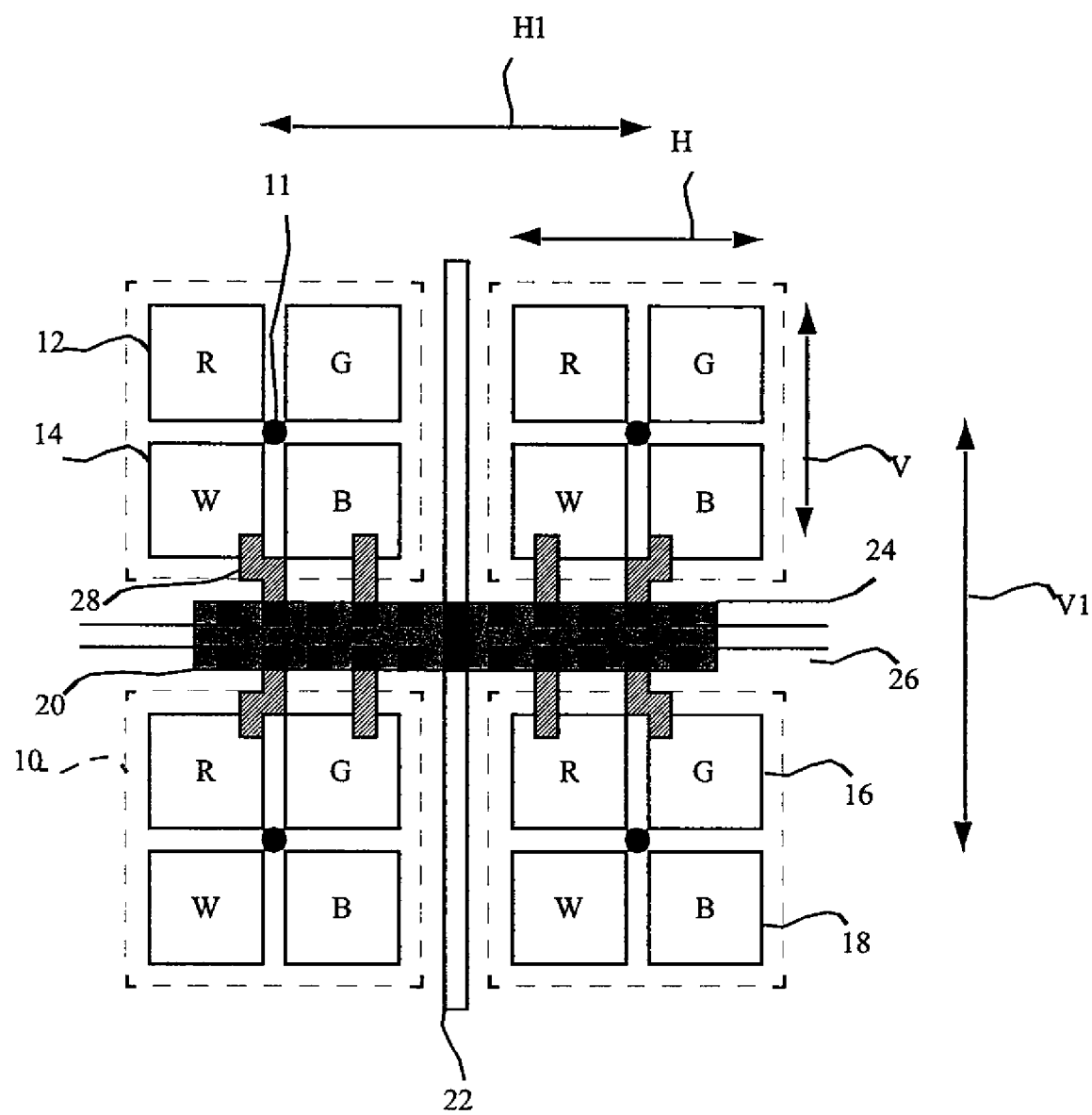
FIG. 15 is a schematic illustrating a display portion having four pixels controlled by an individual chiplet useful in understanding the present invention.

FIGS. 1-4 illustrate chiplets that control one pixel with four sub-pixels each. The present invention is not limited to such an embodiment. For example, as shown in FIGS. 5 and 15, chiplets can control four pixels comprising 16 sub-pixels. Each chiplet is connected to 16 sub-pixels through conductors 28 (shown as an abstract icon for clarity in FIG. 5 and later figures). The center 11 of the pixels is illustrated with a black dot. In FIG. 15, only half of the conductors 28 are indicated for clarity, but all of the 16 sub-pixels shown are controlled by the chiplet. As shown in FIG. 5, the sub-pixels making up the pixels 10 are not separated by a chiplet 20 or by conductors 22. However, the distribution of the pixels is not uniform. As illustrated, the distance V1 between the centers of pixels separated by a chiplet 20 is greater than the distance V2 between the centers of pixels that are not separated by a chiplet 20. Likewise, the distance H1 between the centers of pixels separated by busses 22 is greater than the distance H2 between the centers of pixels that are not separated by busses 22. This non-uniformity can diminish the image quality of the display.

Figure 6:
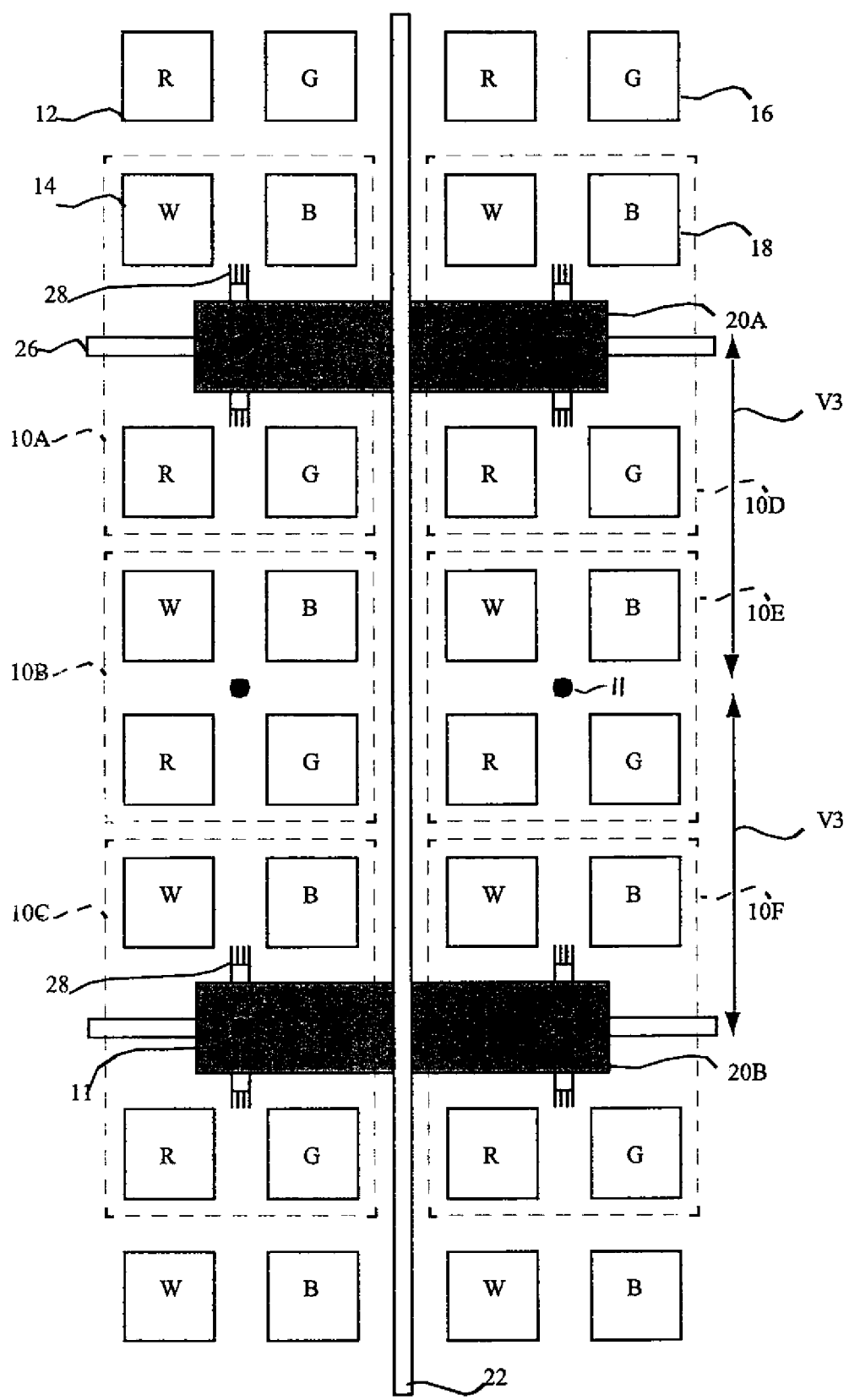
FIG. 6 is a schematic illustrating quad pixels having sub-pixels controlled by two different chiplets in two different rows according to an embodiment of the present invention.

According to the present invention, in one embodiment the control of the sub-pixels of some of the pixels are shared between different chiplets, thereby providing a uniform distribution of pixels, that is the centers of the pixels are uniformly located although the size of the pixels are not necessarily the same. Referring to FIG. 6, the sub-pixels controlled by the chiplets are located in the same position as shown in FIG. 5. However, the pixels are arranged differently, that is different sub-pixels make up the pixels in FIG. 6 as compared to FIG. 5. The assignment of sub-pixel values in an image signal to the physical sub-pixels in the display is different. As shown in FIG. 6, chiplet 20A controls all of the sub-pixels for pixels 10A and 10D. Chiplet 20A controls only the W and B sub-pixels for pixels 10B and 10E. Chiplet 20B controls only the R and G sub-pixels for pixels 10B and 10E. Chiplet 20B controls all of the sub-pixels for pixels 10C and 10F. This mapping of pixels to sub-pixels has the advantage of providing a uniform vertical spacing V3 between the centers of the pixels, thereby improving the image quality of the display.

Figure 7:
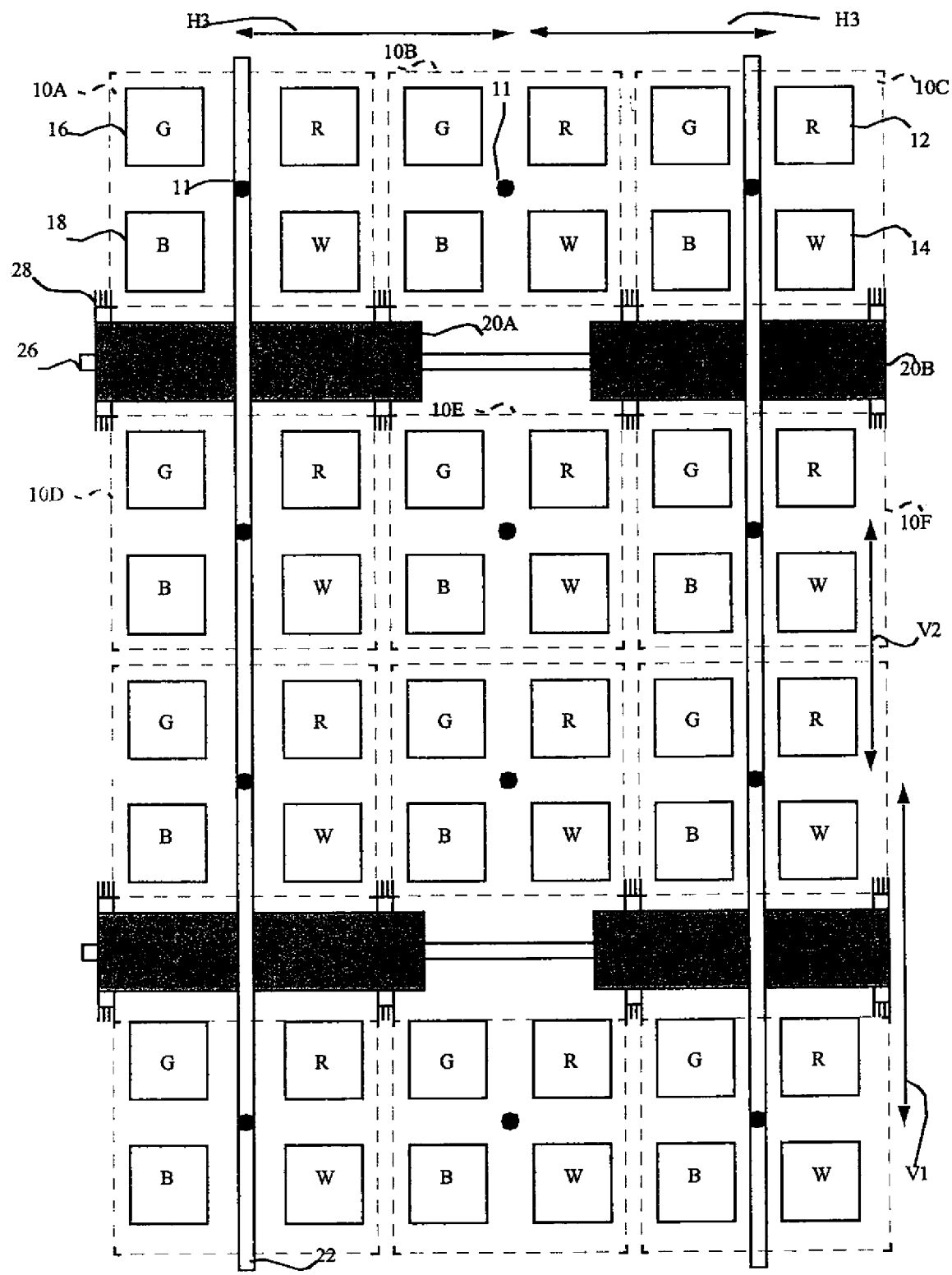
FIG. 7 is a schematic illustrating quad pixels having sub-pixels controlled by two different chiplets in two different columns according to an embodiment of the present invention.

According to the present invention, in another embodiment pixels can be distributed across buss 22 conductors to provide uniform spacing of pixel centers. Referring to FIG. 7, the sub-pixels controlled by the chiplets are located in the same position as shown in FIG. 5. However, the pixels are arranged differently, that is different sub-pixels make up the pixels in FIG. 7 as compared to FIG. 5. The assignment of sub-pixel values in an image signal to the physical sub-pixels in the display is different. As shown in FIG. 7, chiplet 20A controls all of the sub-pixels for pixels 10A and 10D. Chiplet 20A controls only the G and B sub-pixels for pixels 10B and 10E. Chiplet 20B controls only the R and W sub-pixels for pixels 10B and 10E. Chiplet 20B controls all of the sub-pixels for pixels 10C and 10F. This mapping of pixels to sub-pixels has the advantage of providing a uniform horizontal spacing H3 between the centers of the pixels, thereby improving the image quality of the display.

Figure 8:
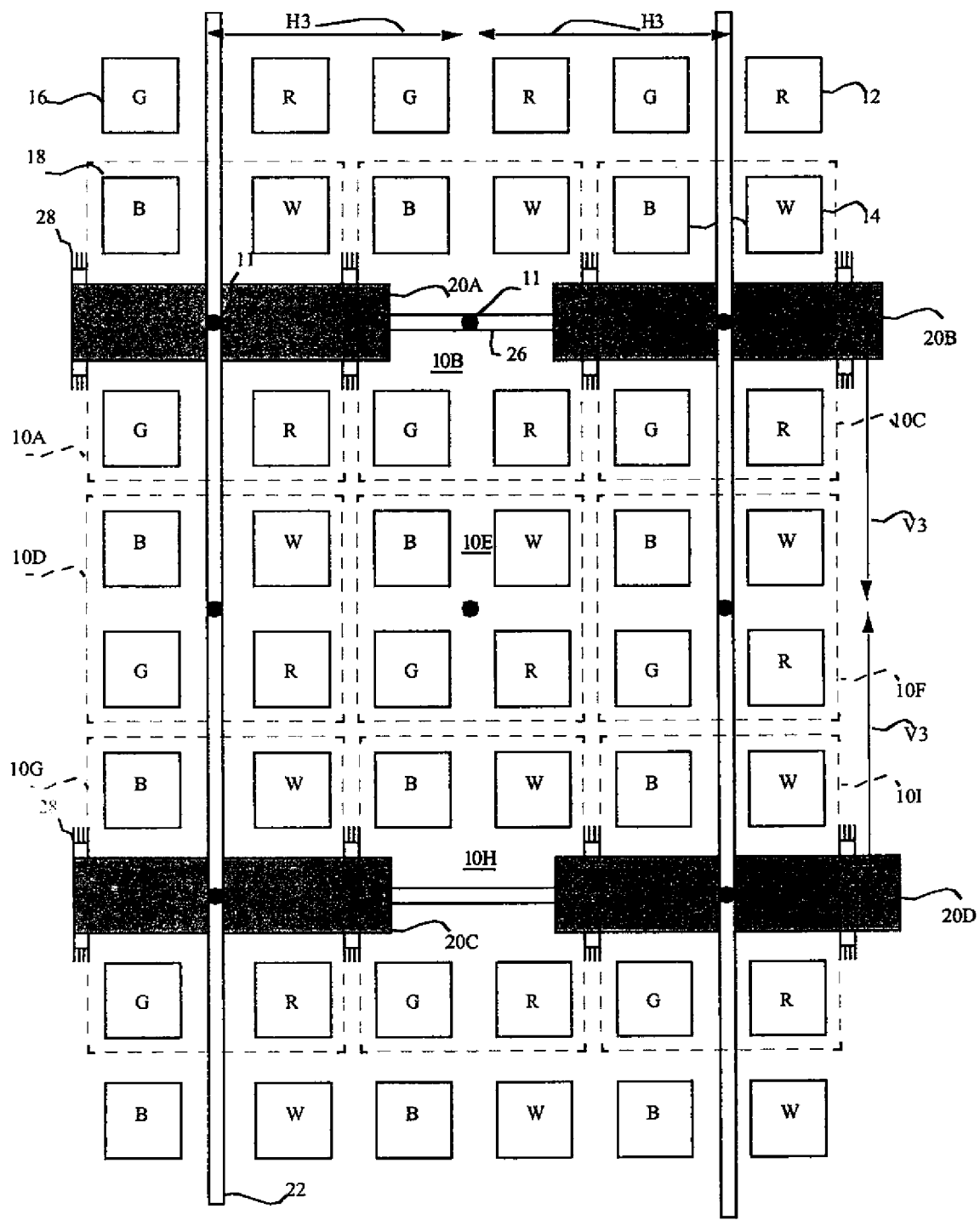
FIG. 8 is a schematic illustrating quad pixels having sub-pixels controlled by four different chiplets in two different rows and two different columns according to another embodiment of the present invention.

Referring to FIG. 8, in another embodiment of the present invention, the spacing between pixel centers in both horizontal and vertical directions can be made uniform. Chiplet 20A controls all of the sub-pixels in pixel 10A. Chiplet 20A controls the B and G sub-pixels in pixel 10B and controls sub-pixels B and W in pixel 10D. Chiplet 20A also controls sub-pixel B in pixel 10E. Chiplet 20B controls all of the sub-pixels in pixel 10C. Chiplet 20B controls the R and W sub-pixels in pixel 10B and controls sub-pixels B and W in pixel 10F. Chiplet 20B also controls sub-pixel W in pixel 10E. Chiplet 20C controls all of the sub-pixels in pixel 10G. Chiplet 20C controls the G and R sub-pixels in pixel 10D and controls sub-pixels B and G in pixel 10H. Chiplet 20C also controls sub-pixel G in pixel 10E. Chiplet 20D controls all of the sub-pixels in pixel 10I. Chiplet 20D controls the R and W sub-pixels in pixel 10H and controls sub-pixels G and R in pixel 10F. Chiplet 20D also controls sub-pixel R in pixel 10E. With this pixel arrangement, all of the pixel centers are spaced by the distance H3 in the horizontal direction and are spaced by the distance V3 in the vertical direction.

The present invention can be applied to pixels laid out in a stripe arrangement as well as in a quad, 2-by-2 arrangement. In various embodiments of the present invention, each pixel can include four sub-pixels and the sub-pixels of each pixel can be arranged in a stripe configuration. Alternatively, each pixel can include three sub-pixels and the sub-pixels of each pixel can be arranged in a stripe configuration.

Figure 9:
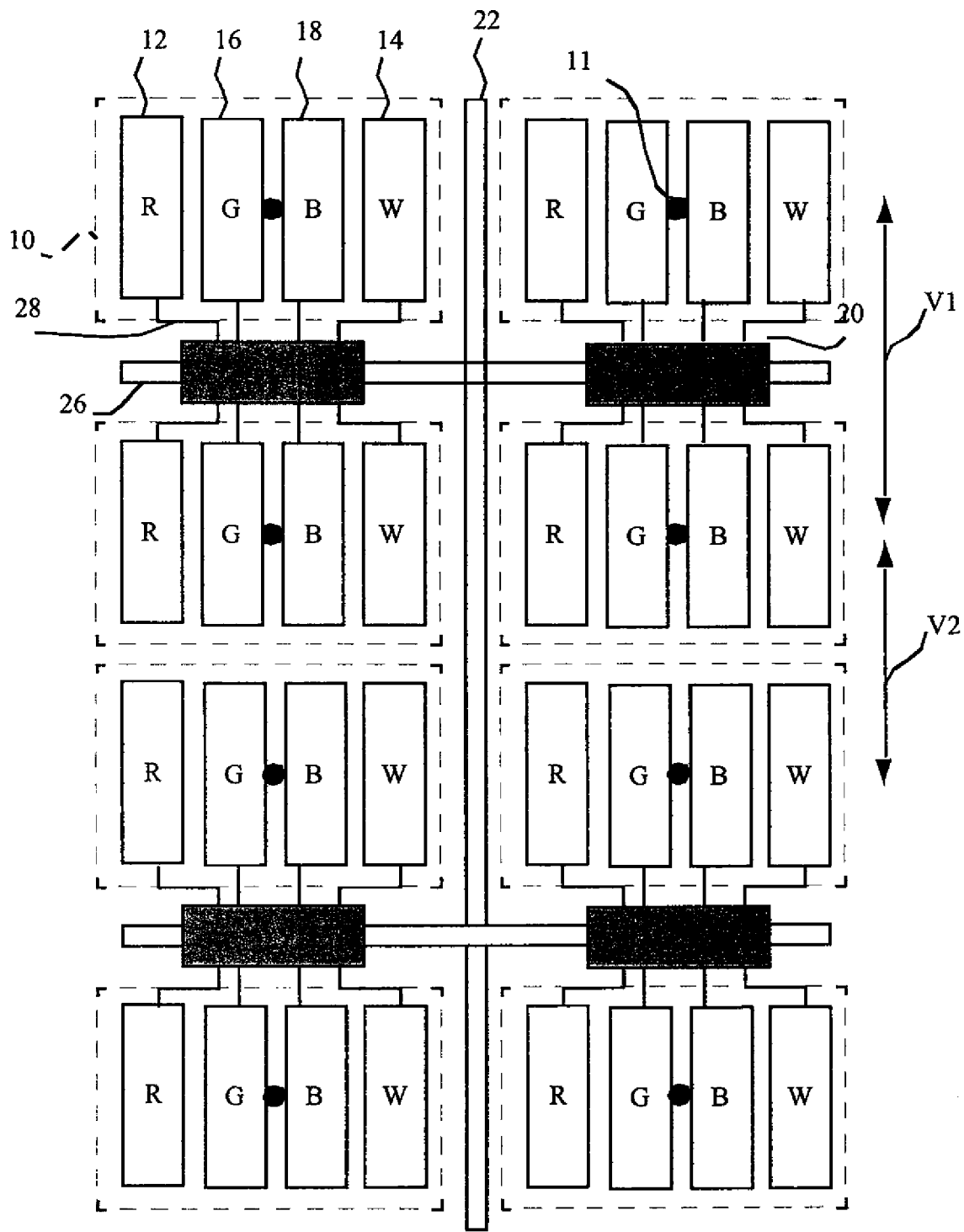
FIG. 9 is a schematic illustrating a display portion having a stripe pixel controlled by individual chiplets useful in understanding the present invention.
Figure 10:
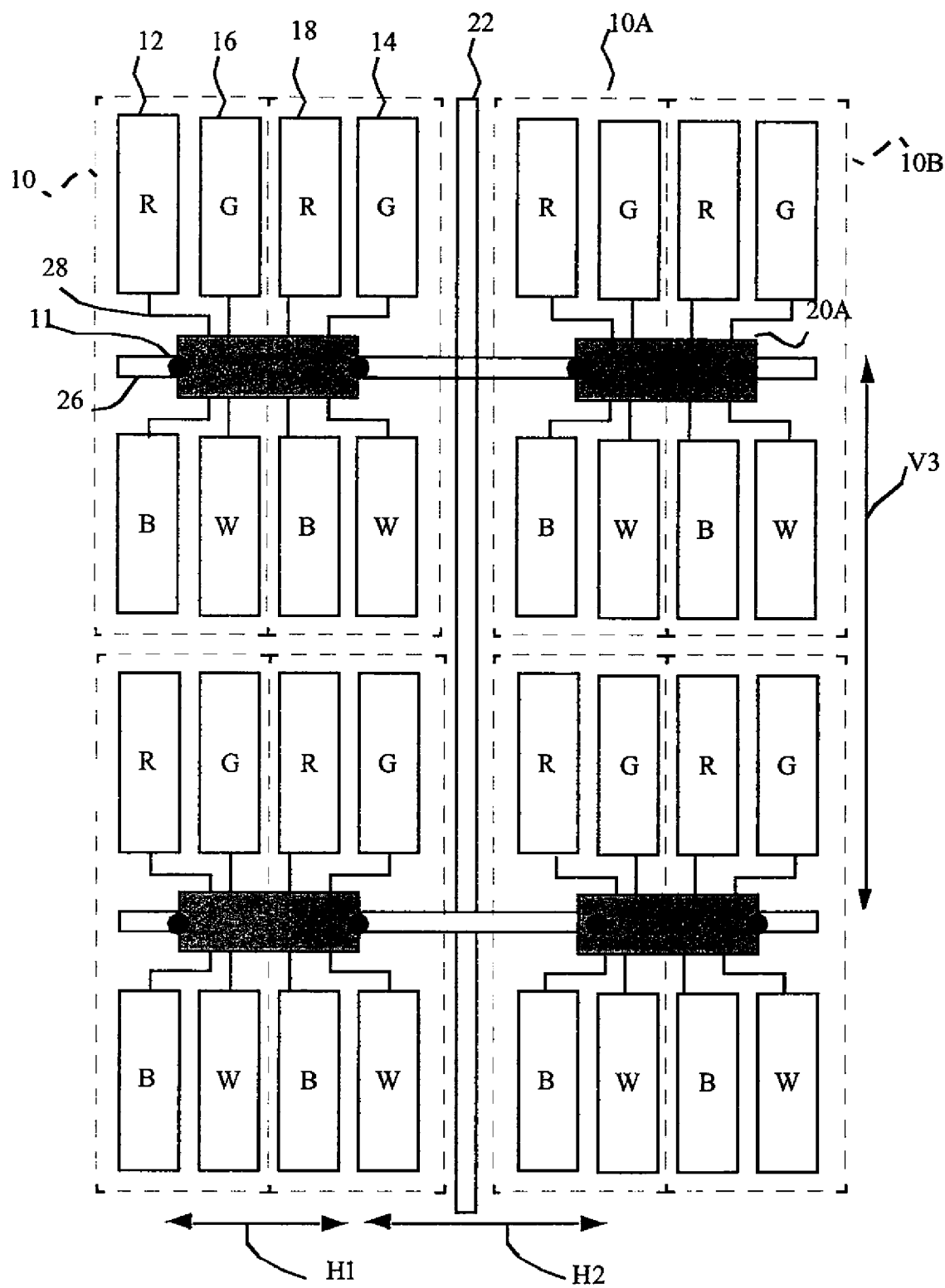
FIG. 10 is a schematic illustrating quad pixels having sub-pixels controlled by two different chiplets in two different rows according to an embodiment of the present invention.

Referring to FIG. 9, in an arrangement of pixels 10, each pixel 10 has four sub-pixels, R 12, G 16, B 18, and W 14 controlled by chiplets 20 through wires 28. In this example, the chiplets 20 control 8 sub-pixels. Pixel centers 11 are not uniformly distributed as can be seen by comparing vertical distances V1 and V2. Referring to FIG. 10 by rearranging the pixel locations and the locations of the sub-pixels, the pixel centers can be uniformly distributed in the vertical direction. Chiplet 20A controls all of the sub-pixels in pixels 10A and 10B. This arrangement provides a consistent vertical pixel spacing of V3. However, this arrangement has converted a stripe arrangement into a quad arrangement and the spacing in the horizontal direction is not uniform, as can be seen by comparing distances H1 and H2.

Figure 11:
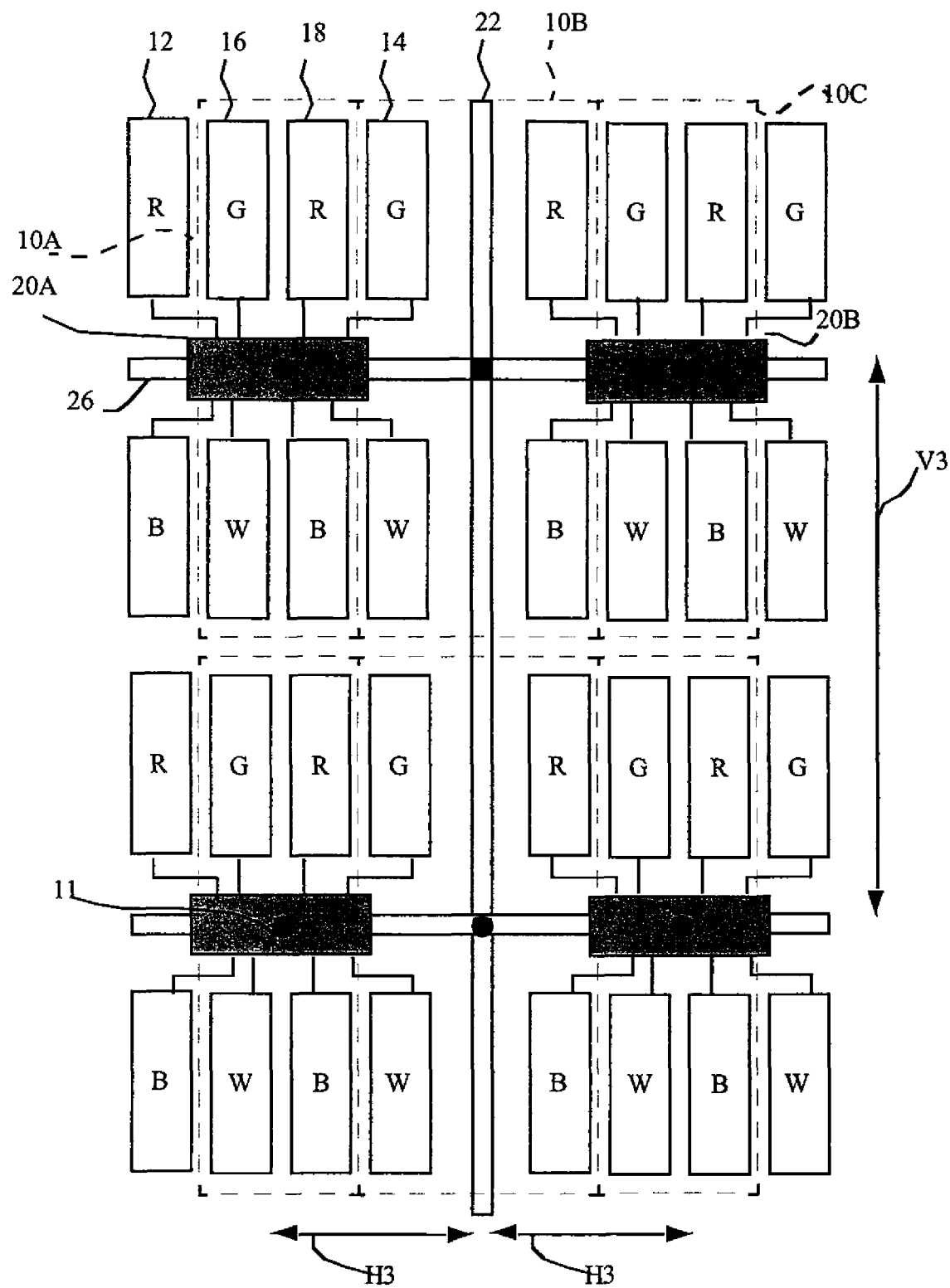
FIG. 11 is a schematic illustrating quad pixels having sub-pixels controlled by four different chiplets in two different rows and two different columns according to an embodiment of the present invention.

Referring to FIG. 11, and according to an embodiment of the present invention, pixels can be arranged to provide a consistent center-to-center spacing in both horizontal and vertical directions as shows with distance horizontal distance H3 and vertical distance V3. In this arrangement, chiplet 20A controls all of the sub-pixels in pixel 10A. Chiplet 20A also controls the G and W sub-pixels of pixel 10B. Chiplet 20B controls all of the sub-pixels in pixel 10C and the R and B sub-pixels of pixel 10B. An arrangement complementary to that of FIG. 8 can also be used, in which some pixels are controlled by four different chiplets, and pixels are separated by chiplets.

Figure 12:
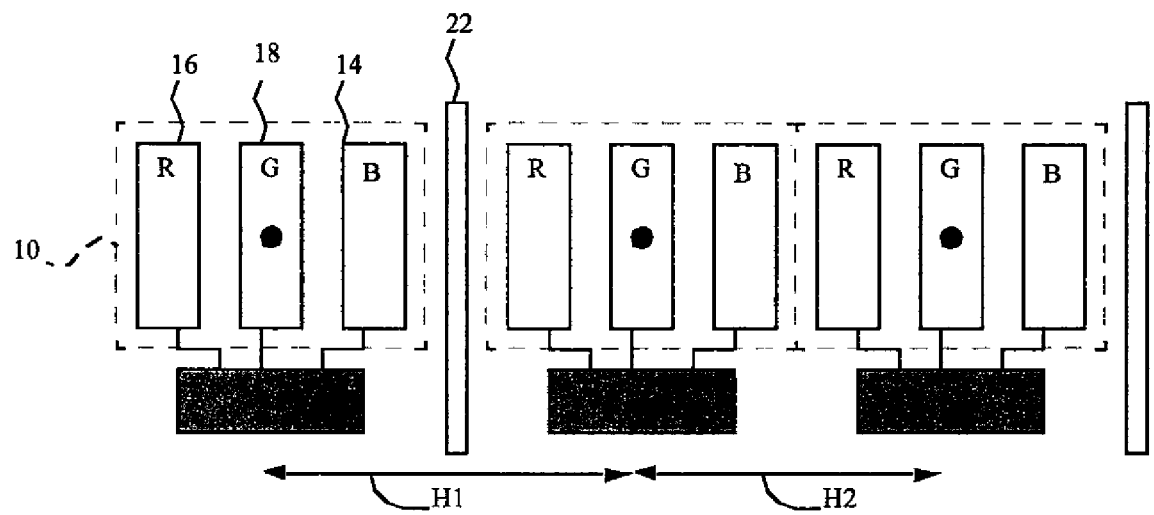
FIG. 12 is a schematic illustrating stripe pixels having sub-pixels controlled by individual chiplets useful in understanding the present invention.
Figure 13:
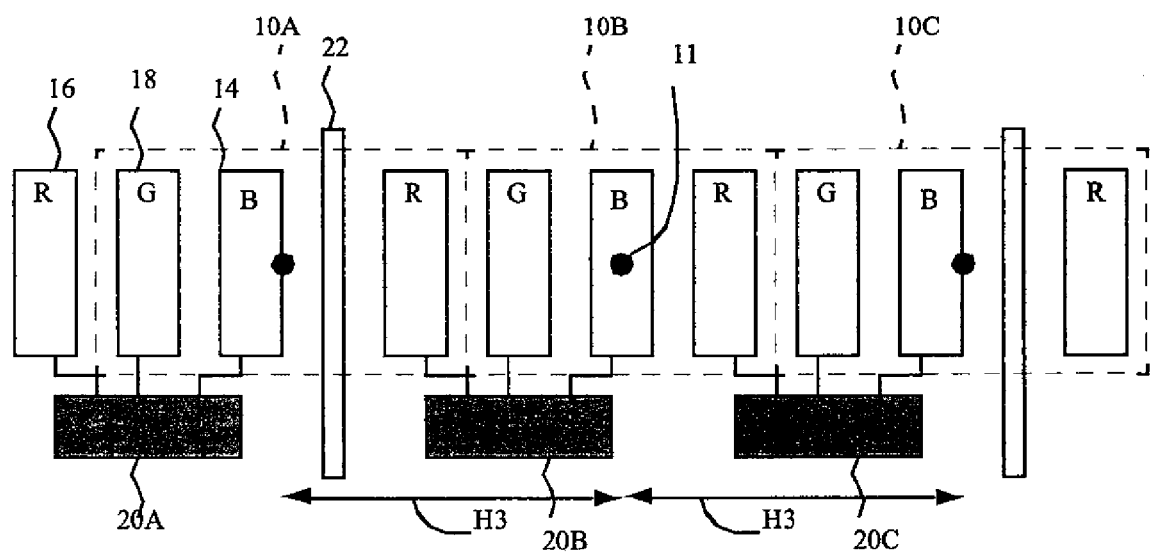
FIG. 13 is a schematic illustrating stripe pixels having sub-pixels controlled by two different chiplets in two different columns according to an embodiment of the present invention.

Referring to FIGS. 12 and 13, the present invention can also be applied to pixel layouts including pixels having only three sub-pixels, e.g. R, G, and B. In FIG. 12, the busses 22 provide signals to, and separate, pairs of chiplets. Each chiplet controls all of the sub-pixels in each pixel. However, this arrangement yields pixels whose centers are not uniformly distributed, as can be seen by comparing horizontal spacing distances H1 and H2. According to an embodiment of the present invention and as illustrated in FIG. 13, by rearranging the pixels (but not the sub-pixels or the control of the sub-pixels), equidistant, uniformly distributed pixel centers 11 can be obtained. In this arrangement, chiplet 20A controls sub-pixels G and B and chiplet 20B controls sub-pixel R of pixel 10A. Chiplet 20B controls sub-pixels G and B and chiplet 20C controls sub-pixel R of pixel 10B. Chiplet 20C controls sub-pixels G and B of pixel 10C.

As can be seen from these examples, the spacing between the centers of each adjacent pixel can be the same in at least one direction, horizontal or vertical, or the spacing between the centers of each adjacent pixel can be the same in at least two orthogonal directions, for example both horizontal and vertical.

While the spacing of the pixel centers can be uniform, the size of the pixels can differ, that is the overall area of the pixels, including space between sub-pixels of the pixel, can be different for different pixels. In general, the size of the pixels can differ because the chiplets can be disposed between sub-pixels of a pixel. Alternatively, the size of the pixels can differ because conductors (for example busses including one or more wires) can be disposed between sub-pixels of a pixel. In yet another embodiment of the present invention, both chiplets and conductors are disposed between sub-pixels of a pixel. Hence, the size of a pixel controlled by a plurality of chiplets can be smaller than the size of a pixel controlled by a single chiplet. In the most extreme case, each sub-pixel of a pixel is controlled by a separate chiplet, for example a pixel having four sub-pixels can be controlled by four different chiplets.

According to various embodiments of the present invention, the chiplets 20 can be constructed in a variety of ways, for example with one or two rows of connection pads 24 along a long dimension of a chiplet 20, as shown in FIGS. 14 and 15. The interconnection busses 26, 22 can be formed from various materials and use various methods for deposition on the device substrate. For example, the interconnection busses 26, 22, or wires 28 can be metal, either evaporated or sputtered, for example aluminum or aluminum alloys. Alternatively, the interconnection busses 26, 22, or wires 28 can be made of cured conductive inks or metal oxides. In one cost-advantaged embodiment, the interconnection busses 26, 22, and wires 28 are formed in a single layer.

The present invention is particularly useful for multi-pixel device embodiments employing a large device substrate, e.g. glass, plastic, or foil, with a plurality of chiplets 20 arranged in a regular arrangement over the device substrate 8. Each chiplet 20 can control a plurality of sub-pixels formed over the device substrate 8 according to the circuitry in the chiplet 20 and in response to control signals. Individual pixel groups or multiple pixel groups can be located on tiled elements, which can be assembled to form the entire display.

According to the present invention, chiplets 20 provide distributed sub-pixel control elements over a substrate 8. A chiplet 20 is a relatively small integrated circuit compared to the device substrate 8 and includes a circuit including conductors, connection pads, passive components such as resistors or capacitors, or active components such as transistors or diodes, formed on an independent substrate. Chiplets 20 are separately manufactured from the display substrate 8 and then applied to the display substrate 8. The chiplets 20 are preferably manufactured using silicon or silicon on insulator (SOI) wafers using known processes for fabricating semiconductor devices. Each chiplet 20 is then separated prior to attachment to the device substrate 8. The crystalline base of each chiplet 20 can therefore be considered a substrate separate from the device substrate 8 and over which the chiplet circuitry is disposed. The plurality of chiplets 20 therefore has a corresponding plurality of substrates separate from the device substrate 8 and each other. In particular, the independent substrates are separate from the substrate 8 on which the pixels 10 are formed and the areas of the independent, chiplet substrates, taken together, are smaller than the device substrate 8. Chiplets 20 can have a crystalline substrate to provide higher performance active components than are found in, for example, thin-film amorphous or polycrystalline silicon devices. Chiplets 20 can have a thickness preferably of 100 um or less, and more preferably 20 um or less. This facilitates formation of the adhesive and planarization material over the chiplet 20 that can then be applied using conventional spin-coating techniques. According to one embodiment of the present invention, chiplets 20 formed on crystalline silicon substrates are arranged in a geometric array and adhered to a device substrate (e.g. 8) with adhesion or planarization materials. Connection pads 24 on the surface of the chiplets 20 are employed to connect each chiplet 20 to signal conductors, power busses and row or column electrodes to drive pixels 10.

Since the chiplets 20 are formed in a semiconductor substrate, the circuitry of the chiplet can be formed using modern lithography tools. With such tools, feature sizes of 0.5 microns or less are readily available. For example, modern semiconductor fabrication lines can achieve line widths of 90 nm or 45 nm and can be employed in making the chiplets of the present invention. The chiplet 20, however, also requires connection pads 24 for making electrical connection to the wiring layer provided over the chiplets once assembled onto the display substrate 8. The connection pads 24 are sized based on the feature size of the lithography tools used on the display substrate 8 (for example 5 um) and the alignment of the chiplets 20 to the wiring layer (for example +/−5 um). Therefore, the connection pads 24 can be, for example, 15 um wide with 5 um spaces between the pads. This means that the pads will generally be significantly larger than the transistor circuitry formed in the chiplet 20.

The pads can generally be formed in a metallization layer on the chiplet over the transistors. It is desirable to make the chiplet with as small a surface area as possible to enable a low manufacturing cost.

By employing chiplets with independent substrates (e.g. comprising crystalline silicon) having circuitry with higher performance than circuits formed directly on the substrate (e.g. amorphous or polycrystalline silicon), a device with higher performance is provided. Since crystalline silicon has not only higher performance but also much smaller active elements (e.g. transistors), the circuitry size is much reduced. A useful chiplet can also be formed using micro-electro-mechanical (MEMS) structures, for example as described in "A novel use of MEMS switches in driving AMOLED", by Yoon, Lee, Yang, and Jang, Digest of Technical Papers of the Society for Information Display, 2008, 3.4, p. 13.

The device substrate 10 can include glass and the wiring layers made of evaporated or sputtered metal or metal alloys, e.g. aluminum or silver, formed over a planarization layer (e.g. resin) patterned with photolithographic techniques known in the art. The chiplets 20 can be formed using conventional techniques well established in the integrated circuit industry.

The present invention can be employed in devices having a multi-pixel infrastructure. In particular, the present invention can be practiced with LED devices, either organic or inorganic, and is particularly useful in information-display devices. In a preferred embodiment, the present invention is employed in a flat-panel OLED device composed of small-molecule or polymeric OLEDs as disclosed in, but not limited to U.S. Pat. No. 4,769,292, issued Sep. 6, 1988 to Tang et al., and U.S. Pat. No. 5,061,569, issued Oct. 29, 1991 to VanSlyke et al. Inorganic devices, for example, employing quantum dots formed in a polycrystalline semiconductor matrix (for example, as taught in US Publication 2007/0057263 by Kahen), and employing organic or inorganic charge-control layers, or hybrid organic/inorganic devices can be employed. Many combinations and variations of organic or inorganic light-emitting displays can be used to fabricate such a device, including active-matrix displays having either a top- or a bottom-emitter architecture.

The invention has been described in detail with particular reference to certain preferred embodiments thereof, but it should be understood that variations and modifications can be effected within the spirit and scope of the invention.

PARTS LIST

H horizontal pixel center spacing
H' horizontal pixel center spacing
H1 horizontal pixel center spacing
H2 horizontal pixel center spacing
H3 horizontal pixel center spacing
V vertical pixel center spacing
V' vertical pixel center spacing
V1 vertical pixel center spacing
V2 vertical pixel center spacing
V3 vertical pixel center spacing
6 display area
8 substrate
10 pixel
10A pixel pixel
10B pixel
10C pixel
10D pixel
10E pixel
10F pixel
10G pixel
10H pixel
10I pixel
11 pixel center
12 red sub-pixel
14 white sub-pixel
16 green sub-pixel
18 blue sub-pixel
20 chiplet
20A chiplet
20B chiplet
20C chiplet
20D chiplet
20E chiplet
20F chiplet
22 buss
24 connection pad
26 buss
28 wire

The invention claimed is:

1. A display device, comprising:
   a) a substrate;
   b) a plurality of full-color pixels formed over the substrate, each full-color pixel including four sub-pixels, the plurality of full-color pixels defining a display area; and
   c) a plurality of chiplets located over the substrate in the display area, each chiplet controlling sub-pixels of at least two adjacent full-color pixels and at least one sub-pixel of a full-color pixel is controlled by a first chiplet and at least one sub-pixel is controlled by a second chiplet, wherein the sub-pixels of each full-color pixel are arranged in a two-by-two configuration.

2. The display device of claim 1, wherein each pixel includes a red sub-pixel, a green sub-pixel, a blue sub-pixel, and a white sub-pixel.

3. The display device of claim 1, wherein a spacing between the center of each adjacent pixel is the same in at least one direction.

4. The display device of claim 3, wherein the spacing between the center of each adjacent pixel is the same in at least two different directions.

5. The display device of claim 3, wherein the size of a pixel is different from the size of a neighboring pixel.

6. The display device of claim 1, wherein chiplets are disposed between sub-pixels of a pixel.

7. The display device of claim 1, wherein chiplets are disposed between pixels.

8. The display device of claim 1, further comprising a plurality of conductors formed over the substrate and wherein conductors are disposed between sub-pixels of a pixel.

9. The display device of claim 8, wherein both chiplets and conductors are disposed between sub-pixels of a pixel.

10. The display device of claim 1, wherein at least one pixel is controlled by four chiplets.

11. A display device, comprising:
    a) a substrate;
    b) a plurality of pixels formed over the substrate, each pixel including four sub-pixels, the plurality of pixels defining a display area; and
    c) a plurality of chiplets located over the substrate in the display area, each chiplet controlling sub-pixels of at least two adjacent pixels and at least one sub-pixel of a pixel is controlled by a first chiplet and at least one sub-pixel is controlled by a second chiplet, wherein the sub-pixels of each pixel are arranged in a two-by-two configuration; wherein the sub-pixels are formed in an array having rows and columns, the chiplets are located between spaced-apart sub-pixels in at least one, but not all rows and columns, and the spacing between sub-pixels spaced apart by the chiplets is greater than the spacing between sub-pixels that are not spaced apart by the chiplets.

12. A display device, comprising:
    a) a substrate;
    b) a plurality of pixels formed over the substrate, each pixel including four sub-pixels, the plurality of pixels defining a display area; and
    c) a plurality of chiplets located over the substrate in the display area, each chiplet controlling sub-pixels of at least two adjacent pixels and at least one sub-pixel of a pixel is controlled by a first chiplet and at least one sub-pixel is controlled by a second chiplet, wherein the sub-pixels of each pixel are arranged in a two-by-two configuration; further comprising a plurality of conductors formed over the substrate and wherein the sub-pixels are formed in an array having rows and columns, the conductors are located between spaced-apart sub-pixels in at least one, but not all rows or columns, and the spacing between sub-pixels spaced apart by the conductors is greater than the spacing between sub-pixels that are not spaced apart by the conductors.

13. A display device, comprising:
    a) a substrate;
    b) a plurality of pixels formed over the substrate, each pixel including four sub-pixels, the plurality of pixels defining a display area; and
    c) a plurality of chiplets located over the substrate in the display area, each chiplet controlling sub-pixels of at least two adjacent pixels and at least one sub-pixel of a pixel is controlled by a first chiplet and at least one sub-pixel is controlled by a second chiplet, wherein the sub-pixels of each pixel are arranged in a two-by-two configuration; wherein the size of a pixel controlled by a plurality of chiplets is smaller than the size of a pixel controlled by a single chiplet.

* * * * *